: 
United States Patent
Kim et al.

(10) Patent No.: US 10,727,292 B2
(45) Date of Patent: Jul. 28, 2020

(54) OLED WITH BUFFER LAYER OVER EMITTING LAYER

(71) Applicant: LG DISPLAY CO., LTD., Seoul (KR)

(72) Inventors: Sungmoo Kim, Paju-si (KR); Jinah Kwak, Paju-si (KR); Sejin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/222,558

(22) Filed: Dec. 17, 2018

(65) Prior Publication Data

US 2019/0206973 A1    Jul. 4, 2019

(30) Foreign Application Priority Data

Dec. 28, 2017 (KR) .......................... 10-2017-0182048

(51) Int. Cl.
*H01L 27/32* (2006.01)
*H01L 51/52* (2006.01)
(Continued)

(52) U.S. Cl.
CPC .......... *H01L 27/3276* (2013.01); *H01L 27/12* (2013.01); *H01L 27/326* (2013.01);
(Continued)

(58) Field of Classification Search
CPC ............. H01L 27/3276; H01L 27/3211; H01L 27/326; H01L 51/5056; H01L 51/5203; H01L 51/56
See application file for complete search history.

(56) References Cited

U.S. PATENT DOCUMENTS 9,825,244 B2 * 11/2017 Cho .................... H01L 51/5004
2006/0280964 A1 * 12/2006 Liu ........................ C09K 11/06
428/690
(Continued)

FOREIGN PATENT DOCUMENTS

EP           3480851 A1    5/2019
KR    10-2016-0082880 A    7/2016
(Continued)

*Primary Examiner* — Peter Bradford
(74) *Attorney, Agent, or Firm* — Birch, Stewart, Kolasch & Birch, LLP (57) ABSTRACT

Discussed is an electroluminescence display apparatus for preventing the performance, efficiency, and lifetime of a device from being reduced. The electroluminescence display apparatus includes a substrate including an active area including a plurality of pixels, a circuit element layer disposed on the substrate, a first electrode disposed on the circuit element layer, an auxiliary electrode disposed on the circuit element layer and spaced apart from the first electrode, a first light emitting layer disposed on the first electrode, a buffer layer disposed on the first light emitting layer, a second light emitting layer disposed on the buffer layer and the auxiliary electrode, and a second electrode disposed on the second light emitting layer. In the electroluminescence display apparatus, since the buffer layer is formed on the first light emitting layer through an inkjet process, the buffer layer can be provided on only the first light emitting layer, and thus, the buffer layer can be formed of an organic material, thereby enhancing the device performance of a blue pixel.

18 Claims, 6 Drawing Sheets

(51) Int. Cl.
*H01L 51/56* (2006.01)
*H01L 51/50* (2006.01)
*H01L 27/12* (2006.01)
*H01L 51/00* (2006.01)

(52) U.S. Cl.
CPC ...... *H01L 27/3211* (2013.01); *H01L 51/5044* (2013.01); *H01L 51/5056* (2013.01); *H01L 51/5203* (2013.01); *H01L 51/5212* (2013.01); *H01L 51/5215* (2013.01); *H01L 51/56* (2013.01); *H01L 27/3272* (2013.01); *H01L 51/0005* (2013.01)

(56) References Cited

U.S. PATENT DOCUMENTS

| | | | | |
|---|---|---|---|---|
| 2012/0074397 | A1* | 3/2012 | Okumoto | H01L 27/3246 257/40 |
| 2013/0056719 | A1* | 3/2013 | Komatsu | H05B 33/26 257/40 |
| 2013/0285042 | A1* | 10/2013 | Komatsu | H01L 27/3279 257/40 |
| 2013/0328024 | A1* | 12/2013 | Mizusaki | H05B 33/10 257/40 |
| 2013/0328039 | A1* | 12/2013 | Ohuchi | H01L 27/3244 257/40 |
| 2014/0197391 | A1* | 7/2014 | Hatakeyama | H01L 51/0005 257/40 |
| 2014/0239262 | A1 | 8/2014 | Kim et al. | |
| 2015/0001498 | A1* | 1/2015 | Cho | H01L 51/0054 257/40 |
| 2015/0144906 | A1 | 5/2015 | Ichikawa | |
| 2015/0155515 | A1* | 6/2015 | Kim | H01L 51/5008 257/40 |
| 2015/0333110 | A1* | 11/2015 | Park | H01L 21/308 257/40 |
| 2016/0028015 | A1* | 1/2016 | Kim | C07D 209/86 257/40 |
| 2016/0079536 | A1* | 3/2016 | Diez | C09K 11/025 257/40 |
| 2016/0126304 | A1 | 5/2016 | Cho et al. | |
| 2016/0155790 | A1 | 6/2016 | Lee et al. | |
| 2016/0240810 | A1 | 8/2016 | Oh et al. | |
| 2017/0110530 | A1* | 4/2017 | Lee | H01L 27/3248 |
| 2018/0006098 | A1* | 1/2018 | Hong | H01L 51/5228 |
| 2019/0013492 | A1* | 1/2019 | Jankus | H01L 51/5076 |
| 2019/0115561 | A1* | 4/2019 | Tang | H01L 27/3258 |
| 2019/0348491 | A1* | 11/2019 | Chung | H01L 27/0296 |

FOREIGN PATENT DOCUMENTS

KR  10-2016-0083539 A  7/2016
WO  WO 2019/071759 A1  4/2019

\* cited by examiner

OLED WITH BUFFER LAYER OVER EMITTING LAYER

CROSS-REFERENCE TO RELATED APPLICATION

This application claims priority under 35 U.S.C. § 119 to Korean Patent Application No. 10-2017-0182048, filed on Dec. 28, 2017 in the Republic of Korea, which is fully incorporated by reference into the present application.

BACKGROUND

Field of the Invention

The present disclosure relates to an electroluminescence display apparatus, and more particularly, to an electroluminescence display apparatus for preventing the performance, efficiency, and lifetime of a device from being reduced.

Discussion of the Related Art

Electroluminescence display apparatuses are apparatuses where a light emitting layer is provided between two electrodes and emits light with an electric field between the two electrodes, thereby displaying an image.

The light emitting layer can be formed of an organic material or an inorganic material such as a quantum dot. In the light emitting layer, an exciton is generated by a combination of an electron and a hole, and when the exciton is shifted from an excited state to a ground state, light is emitted.

Hereinafter, a related art electroluminescence display apparatus will be described with reference to FIG. 1.

FIG. 1 is a schematic cross-sectional view of a related art electroluminescence display apparatus.

Figure 1:
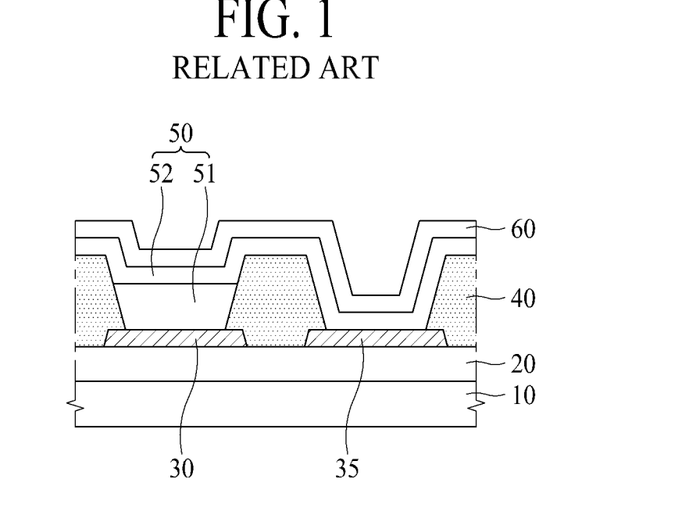
FIG. 1 is a schematic cross-sectional view of a related art electroluminescence display apparatus.

As seen in FIG. 1, the related art electroluminescence display apparatus includes a substrate 10, a circuit element layer 20, a first electrode 30, an auxiliary electrode 35, a bank 40, a light emitting layer 50, and a second electrode 60.

The circuit element layer 20 is provided on the substrate 10. Various signal lines, a thin film transistor (TFT), a capacitor, and a planarization layer are provided in the circuit element layer 20.

The first electrode 30 is provided on the circuit element layer 20. The first electrode 30 is patterned in each of a plurality of pixels and acts as an anode of the related art electroluminescence display apparatus.

The auxiliary electrode 35 is spaced apart from the first electrode 30 and is provided on the circuit element layer 20. The auxiliary electrode 35 is electrically connected to the second electrode 60 and reduces a resistance of the second electrode 60.

The bank 40 is provided in a matrix structure to define an emission area.

The light emitting layer 50 is provided on the first electrode 30 and includes a first light emitting layer 51 and a second light emitting layer 52. The first light emitting layer 51 and the second light emitting layer 52 cooperate to emit light when an electric field is applied across both layers. If the first light emitting layer 51 is not present in an area, light will not be emitted from this area.

The first light emitting layer 51 is formed in the emission area defined by the bank 40 through an inkjet process. Layers deposited by an inkjet process can have a thickness in the center that is smaller than a thickness at the edge thereof. This can lead to a curved upper surface on an inkjet deposited layer. As an example, an inkjet deposited layer, deposited on a flat surface within an area defined by a bank, can have a lower height from the center of the area compared to the height at the bank. The first light emitting layer 51 includes a hole injecting layer (HIL), a hole transporting layer (HTL), and a light emitting material layer (EML).

The second light emitting layer 52 is formed all over the substrate 10 through a deposition process. The second light emitting layer 52 includes an electron transporting layer (ETL) and an electron injecting layer (EIL).

The second electrode 60 is provided on the second light emitting layer 52. The second electrode 60 is provided as a common layer of a plurality of pixels and acts as a cathode of the related art electroluminescence display apparatus.

In the related art electroluminescence display apparatus, the ETL of the second light emitting layer 52 is formed of metal all over the substrate 10 through a deposition process, and thus, is provided on the auxiliary electrode 35 as well as the first electrode 30.

The ETL provided between the auxiliary electrode 35 and the second electrode 60 can be formed of a conductive material in order to electrically connect the auxiliary electrode 35 to the second electrode 60.

Moreover, in the related art electroluminescence display apparatus, since the ETL is formed through a deposition process on the EML which is formed through an inkjet process, an issue occurs at an interface between the EML and the ETL, causing a reduction in the efficiency and lifetime of the apparatus.

SUMMARY

Accordingly, the present disclosure is directed to providing an electroluminescence display apparatus that substantially obviates one or more problems due to limitations and disadvantages of the related art.

An aspect of the present disclosure is directed to providing an electroluminescence display apparatus for preventing the performance, efficiency, and lifetime of a device from being reduced.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided an electroluminescence display apparatus including a substrate including an active area including a plurality of pixels, a circuit element layer disposed on the substrate, a first electrode disposed on the circuit element layer, an auxiliary electrode disposed on the circuit element layer and spaced apart from the first electrode, a first light emitting layer disposed on the first electrode, a buffer layer disposed on the first light emitting layer, a second light emitting layer disposed on the buffer layer and the auxiliary electrode, and a second electrode disposed on the second light emitting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of an electroluminescence display apparatus according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Hereinafter, embodiments of the present disclosure will be described in detail with reference to the accompanying drawings.

Figure 2:
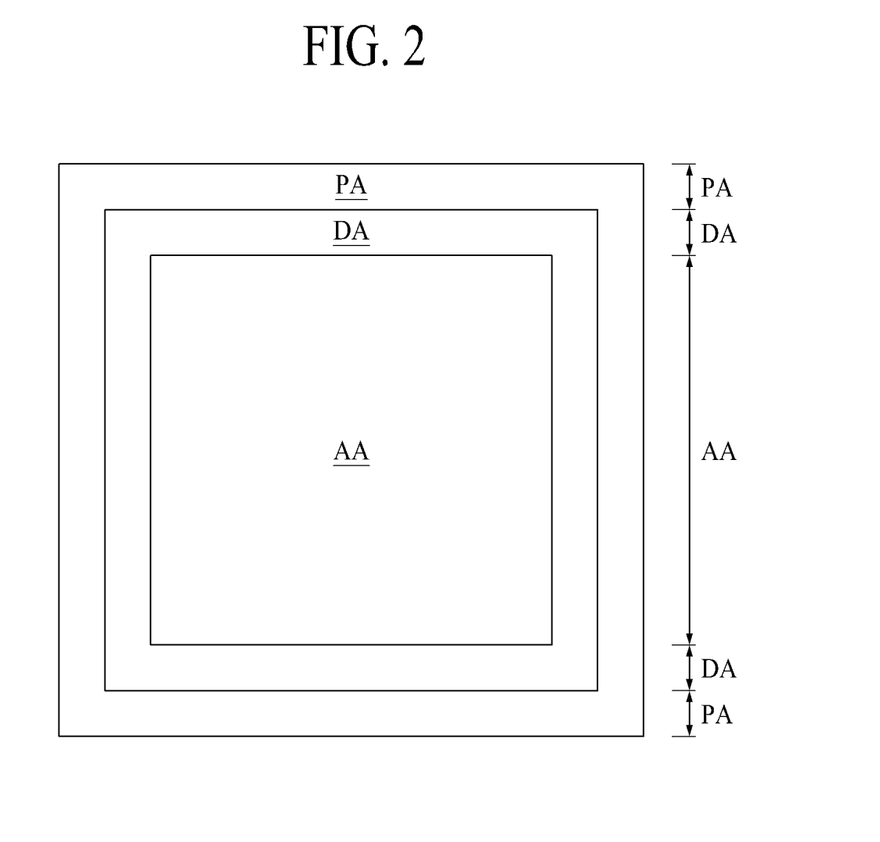
FIG. 2 is a schematic plan view of an electroluminescence display apparatus according to an embodiment of the present disclosure.

FIG. 2 is a schematic plan view of an electroluminescence display apparatus according to an embodiment of the present disclosure. All the components of the electroluminescence display apparatus according to all embodiments of the present disclosure are operatively coupled and configured.

As seen in FIG. 2, the electroluminescence display apparatus according to an embodiment of the present disclosure can include an active area AA, a dummy area DA, and a pad area PA.

The active area AA can function as a display area which displays an image. A plurality of pixels can be provided in the active area AA, and an emission area can be provided in each of the plurality of pixels.

In detail, signal lines such as a gate line, a data line, a power line, and a reference line can be provided in each of the plurality of pixels provided in the active area AA. Also, a plurality of thin film transistors (TFTs) for switching transfers of signals applied through the signal lines can be provided in each pixel provided in the active area AA, and a light emitting device which is driven by the plurality of TFTs to emit light can be provided in each pixel.

The dummy area DA can be disposed to surround the active area AA.

In detail, the dummy area DA can be disposed outside upper, lower, left, and right sides of the active area AA. A plurality of dummy pixels can be provided in the dummy area DA, and a dummy emission area can be provided in each of the plurality of dummy pixels. Since the dummy area DA is not the display area which displays an image, the dummy pixels provided in the dummy area DA can have a structure which differs from that of each pixel provided in the active area AA. For example, at least one of a signal line, a TFT, and a light emitting device may not be provided or can be incompletely provided in each of the dummy pixels provided in the dummy area DA, and thus, light may not be emitted from each dummy pixel provided in the dummy area DA. If light is emitted in the dummy area DA, the image quality of the electroluminescence display apparatus is degraded due to leakage light occurring in the dummy area DA.

The dummy area DA prevents a process error from occurring between a center and an outer portion of the active area AA. This will be described below in detail.

A plurality of stacking processes and a plurality of mask processes can be performed for forming the plurality of pixels in the active area AA. Each of the stacking processes can be a process of forming an insulation layer, a metal layer, or an organic layer through a physical deposition process, a chemical deposition process, a coating process, or an inkjet process, and each of the mask processes can be a process of patterning the insulation layer, the metal layer, or the organic layer formed through the stacking processes to have a certain shape by using a photolithography process known to those skilled in the art.

As described above, when the plurality of stacking processes and the plurality of mask processes are performed on the active area AA, there is a possibility that a process error occurs between the center and an edge of the active area AA due to process characteristic. For this reason, the dummy area DA can be provided in the edge of the active area AA, and thus, in a case where an error occurs, the error occurs in the dummy area DA without occurring in the active area AA.

Particularly, when a light emitting layer of the light emitting device is formed through an inkjet process, a difference in drying the light emitting layer may occur between a center and an edge of a substrate, and in this case, if the dummy area DA is not provided, light emission between the center and the edge of the active area AA is not uniform.

Therefore, the dummy area DA can be provided outside the active area AA, and thus, in a case where the light emitting layer of the light emitting device is formed through the inkjet process, drying of the light emitting layer is not uniform between the active area AA and the dummy area DA, but drying of the light emitting layer is wholly uniform in the active area AA.

The pad area PA can be disposed outside the dummy area DA.

A circuit driver such as a gate driver or a data driver can be provided in the pad area PA. The circuit driver can be disposed outside at least one of upper, lower, left, and right sides of the dummy area DA. The circuit driver provided in the pad area PA can be connected to the circuit element disposed in the active area AA via the dummy area DA.

Figure 3:
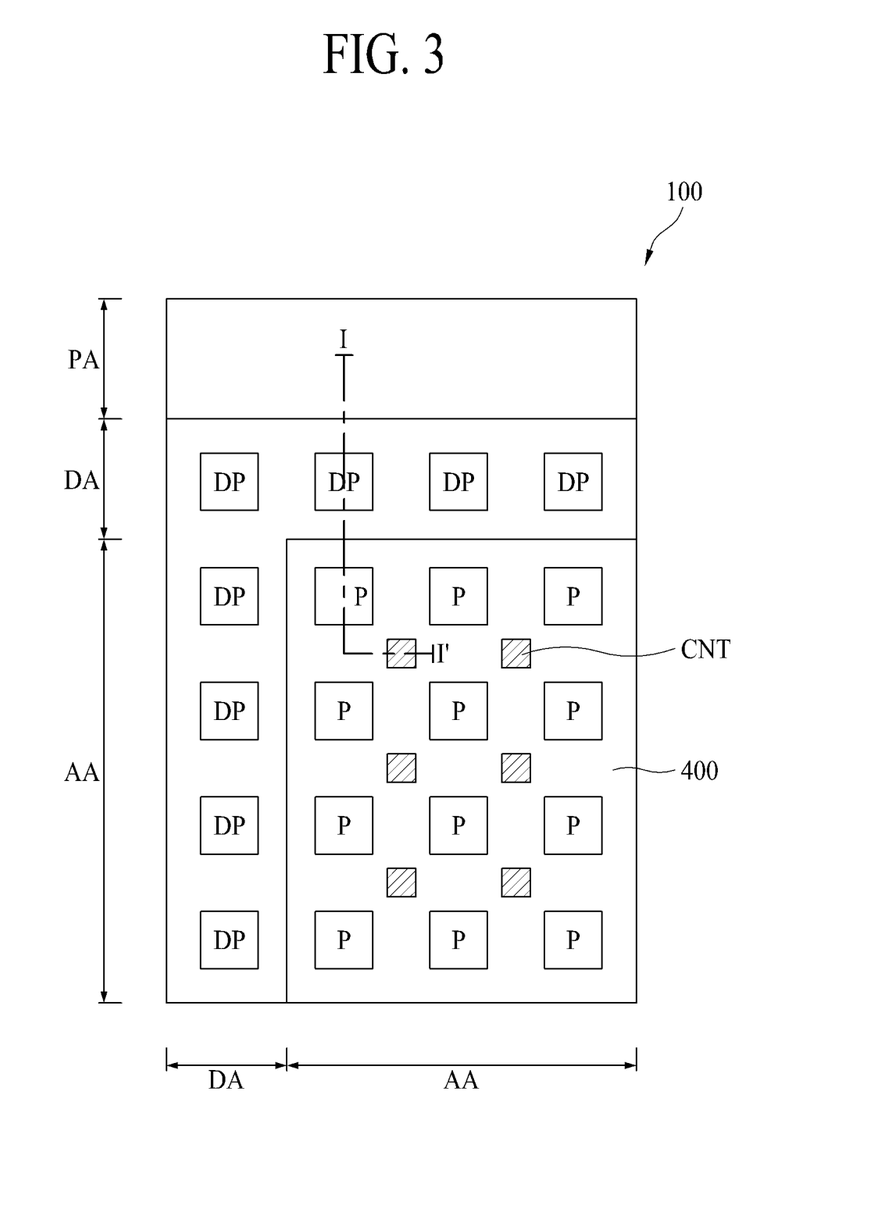
FIG. 3 is a schematic plan view illustrating pixels in an active area and a dummy area of an electroluminescence display apparatus according to an embodiment of the present disclosure.

FIG. 3 is a schematic plan view illustrating pixels in an active area and a dummy area of an electroluminescence display apparatus according to an embodiment of the present disclosure.

As seen in FIG. 3, in the electroluminescence display apparatus, an active area AA can be provided on a substrate 100, and a dummy area DA can be provided outside the active area AA. A pad area PA can be provided outside the dummy area DA, and a plurality of pads can be disposed in the pad area PA. FIG. 3 schematically illustrates a left upper area of the substrate 100.

A plurality of pixels P can be provided in the active area AA. The plurality of pixels P can include a red pixel which emits red light, a green pixel which emits green light, and a blue pixel which emits blue light, but are not limited thereto.

In the plurality of pixels P, an emission area can be defined by a bank 400. The bank 400 can be disposed to surround an edge of each of the plurality of pixels P. In this case, a contact part CNT for electrically connecting a second electrode to an auxiliary electrode can be provided between adjacent pixels of the plurality of pixels P. The contact part CNT can be a region which exposes the auxiliary electrode by a hole provided in the bank 400.

The plurality of pixels P can be arranged in a matrix type as illustrated in FIG. 3, but are not limited thereto. In other embodiments, the plurality of pixels P can be arranged in various types known to those skilled in the art.

A plurality of dummy pixels DP can be provided in the dummy area DA. Some of the plurality of dummy pixels DP can be arranged in a column which differs from a column in which pixels P are arranged. Also, some of the plurality of dummy pixels DP can be arranged in a column that is same with the column in which pixels P are arranged.

Figure 4:
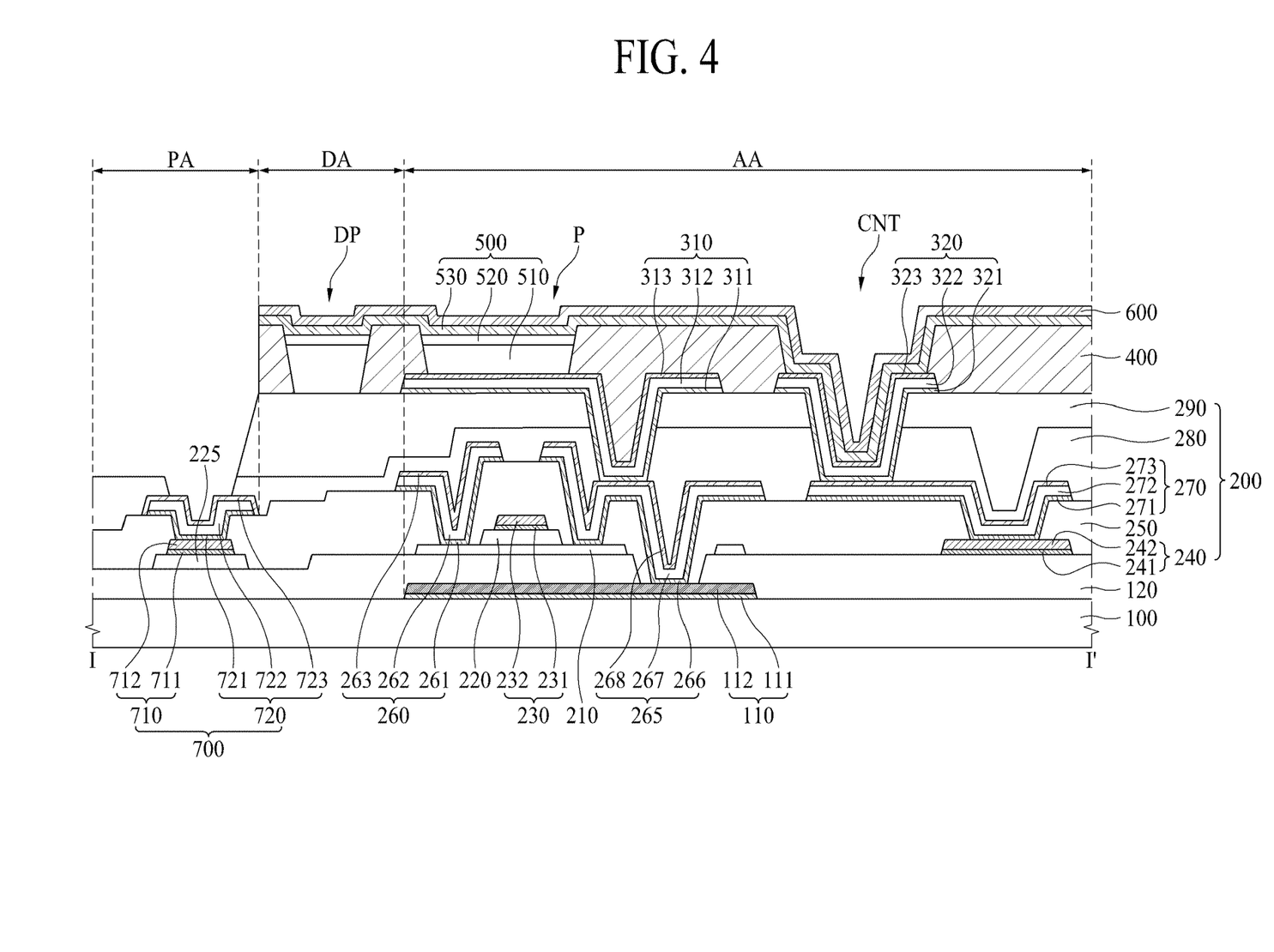
FIG. 4 is a cross-sectional view of an electroluminescence display apparatus according to an embodiment of the present disclosure and is a cross-sectional view taken along line I-I' of FIG. 3.
Figure 5A:
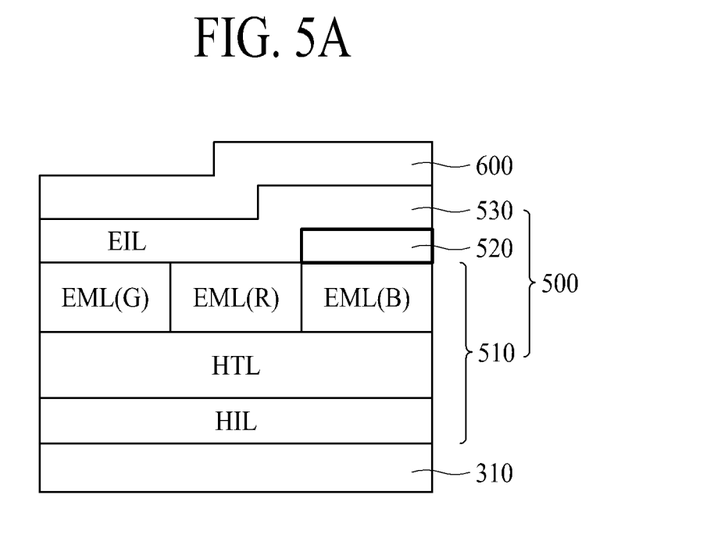
FIG. 5A is a schematic cross-sectional view illustrating an organic light emitting device of an electroluminescence display apparatus according to an embodiment of the present disclosure.
Figure 5B:
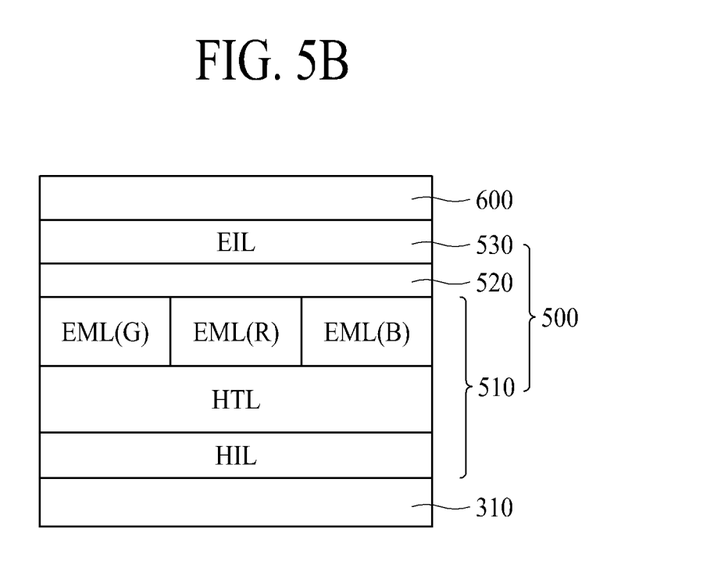
FIG. 5B is a schematic cross-sectional view illustrating an organic light emitting device of an electroluminescence display apparatus according to an embodiment of the present disclosure.

FIG. 4 is a cross-sectional view of an electroluminescence display apparatus according to an embodiment of the present disclosure and is a cross-sectional view taken along line I-I' of FIG. 3, and each of FIG. 5A and FIG. 5B is a schematic cross-sectional view illustrating an organic light emitting device of the electroluminescence display apparatus according to an embodiment of the present disclosure.

As seen in FIG. 4, the electroluminescence display apparatus according to an embodiment of the present disclosure can include an active area AA, a dummy area DA, and a pad area PA, which are provided on a substrate 100.

The substrate 100 can be formed of glass, plastic, and/or the like, but is not limited thereto. The substrate 100 can be formed of a transparent material, or can be formed of an opaque material.

A light blocking layer 110 can be disposed on the substrate 100. The light blocking layer 110 can be additionally provided between the substrate 100 and an active layer 210 and can block the traveling of light to the active layer 210, thereby preventing the active layer 210 from being deteriorated. The light blocking layer 110 can include a lower light blocking layer 111 and an upper light blocking layer 112.

The lower light blocking layer 111 can be provided between the substrate 100 and the upper light blocking layer 112 and can enhance an adhesive force between the substrate 100 and the upper light blocking layer 112. Also, the lower light blocking layer 111 can protect a lower surface of the upper light blocking layer 112, thereby preventing the lower surface of the upper light blocking layer 112 from being corroded. Therefore, an oxidation rate of the lower light blocking layer 111 can be lower than that of the upper light blocking layer 112. That is, the lower light blocking layer 111 can be formed of a material which is stronger in corrosion resistance than a material of the upper light blocking layer 112. As described above, the lower light blocking layer 111 can act as an adhesive force enhancement layer or an anti-corrosion layer and can be formed of titanium (Ti) or an alloy (MoTi) of molybdenum (Mo) and Ti, but is not limited thereto.

The upper light blocking layer 112 can be provided on the lower light blocking layer 111. The upper light blocking layer 112 can be formed of copper (Cu) or aluminum (Al), which is low in resistance, but is not limited thereto. The upper light blocking layer 112 can be formed of a material which is relatively lower in resistance than the lower light blocking layer 111. The upper light blocking layer 112 can be connected to a drain electrode 265, and a thickness of the upper light blocking layer 112 can be set thicker than that of the lower light blocking layer 111 so as to reduce a resistance of the drain electrode 265.

A buffer layer 120 can be disposed on the substrate 100. The buffer layer 120 can be disposed on the substrate 100 and the light blocking layer 110, for protecting a thin film transistor (TFT) from water penetrated through the substrate 100 vulnerable to penetration of water.

The electroluminescence display apparatus according to an embodiment of the present disclosure can be implemented as a top emission type where emitted light travels to an upper portion, and in this case, a material of the substrate 100 can use an opaque material as well as a transparent material.

Moreover, the electroluminescence display apparatus according to an embodiment of the present disclosure can be implemented as a bottom emission type where emitted light travels to a lower portion, and in this case, the material of the substrate 100 can use a transparent material.

A circuit element layer 200, a first electrode 310, an auxiliary electrode 320, a bank 400, a light emitting layer 500, and a second electrode 600 can be provided in the active area AA on the substrate 100.

The circuit element layer 200 can be provided on the substrate 100. The circuit element layer 200 can include the active layer 210, a gate insulation layer 220, a gate electrode 230, an auxiliary line 240, an interlayer insulation layer 250, a source electrode 260, the drain electrode 265, a connection line 270, a passivation layer 280, and a planarization layer 290.

The active layer 210 can be provided on the substrate 100. The active layer 210 can be formed of a silicon-based semiconductor material, an oxide semiconductor material, and/or the like, but is not limited thereto.

The gate insulation layer 220 can be provided on the active layer 210 and can insulate the active layer 210 from the gate electrode 230.

The gate electrode 230 can be provided on the gate insulation layer 220. The gate electrode 230 can include a lower gate electrode 231 and an upper gate electrode 232.

The lower gate electrode 231 can be provided between the gate insulation layer 220 and the upper gate electrode 232 and can enhance an adhesive force between the gate insulation layer 220 and the upper gate electrode 232. Also, the lower gate electrode 231 can protect a lower surface of the upper gate electrode 232, thereby preventing the lower surface of the upper gate electrode 232 from being corroded. Therefore, an oxidation rate of the lower gate electrode 231 can be lower than that of the upper gate electrode 232. That is, the lower gate electrode 231 can be formed of a material which is stronger in corrosion resistance than a material of the upper gate electrode 232. As described above, the lower gate electrode 231 can act as an adhesive force enhancement layer or an anti-corrosion layer and can be formed of Ti or an alloy (MoTi) of Mo and Ti, but is not limited thereto.

The upper gate electrode 232 can be provided on the lower gate electrode 231. The upper gate electrode 232 can be formed of Cu or Al, which is low in resistance, but is not limited thereto. The upper gate electrode 232 can be formed of a material which is relatively lower in resistance than the lower gate electrode 231. A thickness of the upper gate electrode 232 can be set thicker than that of the lower gate electrode 231 so as to reduce a resistance of the gate electrode 230.

The auxiliary line 240 can be disposed on the same layer as the gate electrode 230 and can be spaced apart from the gate electrode 230. The auxiliary line 240 can be formed simultaneously with the gate electrode 230 through the same process and can be formed of the same material as that of the gate electrode 230. The auxiliary line 240 can include a lower auxiliary line 241 and an upper auxiliary line 242. The lower auxiliary line 241 and the upper auxiliary line 242 can be formed of the same material as that of each of the lower gate electrode 231 and the upper gate electrode 232.

The auxiliary line 240 can be electrically connected to the auxiliary electrode 320 which will be described below. Since the auxiliary line 240 is electrically connected to the auxiliary electrode 320, a resistance of each of the auxiliary electrode 320 and the second electrode 600 can be reduced.

The interlayer insulation layer 250 can be provided on the gate electrode 230 and can insulate the gate electrode 230 from the source and drain electrodes 260 and 265.

The source electrode 260 and the drain electrode 265 can face each other and can be spaced apart from each other on the interlayer insulation layer 250. The source electrode 260 can be connected to one end of the active layer 210 through a contact hole which is provided in the interlayer insulation layer 250, and the drain electrode 265 can be connected to the other end of the active layer 210 through another contact hole which is provided in the interlayer insulation layer 250. The source electrode 260 can include a lower source electrode 261, a middle source electrode 262, and an upper source electrode 263, and the drain electrode 265 can include a lower drain electrode 266, a middle drain electrode 267, and an upper drain electrode 268.

The lower source and drain electrodes 261 and 266 can be provided between the interlayer insulation layer 150 and the middle source and drain electrodes 262 and 267 and can enhance an adhesive force between the interlayer insulation layer 150 and the middle source and drain electrodes 262 and 267. Also, the lower source and drain electrodes 261 and 266 can protect lower surfaces of the middle source and drain electrodes 262 and 267, thereby preventing the lower surfaces of the middle source and drain electrodes 262 and 267 from being corroded.

Therefore, an oxidation rate of each of the lower source and drain electrodes 261 and 266 can be lower than that of each of the middle source and drain electrodes 262 and 267. That is, the lower source and drain electrodes 261 and 266 can be formed of a material which is stronger in corrosion resistance than a material of each of the middle source and drain electrodes 262 and 267. As described above, each of the lower source and drain electrodes 261 and 266 can act as an adhesive force enhancement layer or an anti-corrosion layer and can be formed of an alloy (MoTi) of Mo and Ti, but is not limited thereto.

The middle source and drain electrodes 262 and 267 can be provided between the lower source and drain electrodes 261 and 266 and the upper source and drain electrodes 263 and 268. The middle source and drain electrodes 262 and 267 can be formed of Cu which is low in resistance, but is not limited thereto. The middle source and drain electrodes 262 and 267 can be formed of a material which is relatively lower in resistance than the lower source and drain electrodes 261 and 266. A thickness of each of the middle source and drain electrodes 262 and 267 can be set thicker than that of each of the lower source and drain electrodes 261 and 266 so as to reduce a total resistance of the source and drain electrodes 260 and 265.

The upper source and drain electrodes 263 and 268 can be provided between the passivation layer 280 and the middle source and drain electrodes 262 and 267 and can enhance an adhesive force between the passivation layer 280 and the middle source and drain electrodes 262 and 267. Also, the upper source and drain electrodes 263 and 268 can protect upper surfaces of the middle source and drain electrodes 262 and 267, thereby preventing the upper surfaces of the middle source and drain electrodes 262 and 267 from being corroded.

Therefore, an oxidation rate of each of the upper source and drain electrodes 263 and 268 can be lower than that of each of the middle source and drain electrodes 262 and 267. That is, the upper source and drain electrodes 263 and 268 can be formed of a material which is stronger in corrosion resistance than a material of each of the middle source and drain electrodes 262 and 267. As described above, each of the upper source and drain electrodes 263 and 268 can act as an adhesive force enhancement layer or an anti-corrosion layer and can be formed of a transparent conductive material such as indium tin oxide (ITO), but is not limited thereto.

The connection line 270 can be disposed on the same layer as the source and drain electrodes 260 and 265 and can be spaced apart from the source and drain electrodes 260 and 265. The connection line 270 and the source and drain electrodes 260 and 265 can be simultaneously formed of the same material through the same process. The connection line 270 can include a lower connection line 271, a middle connection line 272, and an upper connection line 273.

The lower connection line 271 can be formed of the same material as that of each of the lower source and drain electrodes 261 and 266 to have the same thickness as that of each of the lower source and drain electrodes 261 and 266, and the middle connection line 272 can be formed of the same material to have the same thickness as each of the middle source and drain electrodes 262 and 267. Also, the upper connection line 273 can be formed of the same material to have the same thickness as each of the upper source and drain electrodes 263 and 268. In this case, the connection line 270 and the source and drain electrodes 260 and 265 can be simultaneously formed through the same process.

The connection line 270 can be electrically connected to the auxiliary electrode 320 which will be described below. Since the connection line 270 is electrically connected to the auxiliary electrode 320, a resistance of each of the auxiliary electrode 320 and the second electrode 600 can be reduced.

The passivation layer 280 can be provided on the source electrode 260, the drain electrode 265, and the connection line 270 and can protect the TFT.

The planarization layer 290 can be provided on the passivation layer 280 and can planarize a surface on the substrate 100.

As described above, the circuit element layer 200 can include a TFT which includes the active layer 210, the gate electrode 230, the source electrode 260, and the drain electrode 265. In FIG. 4, a TFT having a top gate structure where the gate electrode 230 is provided on the active layer 230 is illustrated, but is not limited thereto. For example, in other embodiments, the circuit element layer 200 can include a TFT having a bottom gate structure where the gate electrode 230 is provided under the active layer 230.

In the circuit element layer 200, a circuit element including various signal lines, TFTs, and a capacitor can be provided in each of a plurality of pixels. The signal lines can include a gate line, a data line, a power line, and a reference line, and the TFTs can include a switching TFT, a driving TFT, and a sensing TFT. The TFT illustrated in FIG. 4 can correspond to the driving TFT.

The switching TFT can be turned on by a gate signal supplied through the gate line and can transfer a data voltage, supplied through the data line, to the driving TFT.

The driving TFT can be turned on by the data voltage transferred from the switching TFT to generate a data current from a power supplied through the power line and can supply the data current to the first electrode 310.

The sensing TFT can sense a threshold voltage deviation of the driving TFT which causes the degradation in image quality. The sensing TFT can supply a current of the driving TFT to the reference line in response to a sensing control signal supplied through the gate line or a separate sensing line.

The capacitor can hold the data voltage supplied to the driving TFT during one frame and can be connected to a gate electrode and a source electrode of the driving TFT.

In a case where the electroluminescence display apparatus according to an embodiment of the present disclosure is implemented as the top emission type, light emission is not affected by the TFT even when the TFT is disposed under the light emitting layer 500, and thus, the TFT can be disposed under the light emitting layer 500.

The first electrode 310 can be provided on the circuit element layer 200. The first electrode 310 can be patterned in each of the plurality of pixels and can act as an anode of the electroluminescence display apparatus.

When the electroluminescence display apparatus according to an embodiment of the present disclosure is implemented as the top emission type, the first electrode 310 can include a reflective material for reflecting light, emitted from the light emitting layer 500, to an upper portion. In this case, the first electrode 310 can have a stacked structure including a transparent conductive material and the reflective material. On the other hand, when the electroluminescence display apparatus according to an embodiment of the present disclosure is implemented as the bottom emission type, the first electrode 310 can be formed of the transparent conductive material.

The first electrode 310 can be connected to the drain electrode 265 of the TFT through a contact hole which is provided in the planarization layer 290 and the passivation layer 280. Depending on the case, the first electrode 310 can be connected to the source electrode 260 of the TFT through a contact hole which is provided in the planarization layer 290 and the passivation layer 280.

The auxiliary electrode 320 can be disposed on the same layer as the first electrode 310 and can be spaced apart from the first electrode 310. The auxiliary electrode 320 and the first electrode 310 can be simultaneously formed of the same material through the same process.

The auxiliary electrode 320 can be electrically connected to the second electrode 600. Since the auxiliary electrode 320 is electrically connected to the second electrode 600, the resistance of the second electrode 600 can be reduced.

The auxiliary electrode 320 can include a lower auxiliary electrode 321, a middle auxiliary electrode 322, and an upper auxiliary electrode 323. The first electrode 310 can include a lower first electrode 311, a middle first electrode 312, and an upper first electrode 313.

The lower first electrode 311 can be provided between the planarization layer 290 and the middle first electrode 312 to enhance an adhesive force between the planarization layer 290 and the middle first electrode 312, and the lower auxiliary electrode 321 can be provided between the planarization layer 290 and the middle auxiliary electrode 322 to enhance an adhesive force between the planarization layer 290 and the middle auxiliary electrode 322. Also, the lower first electrode 311 can protect a lower surface of the middle first electrode 312, and the lower auxiliary electrode 321 can protect a lower surface of the middle auxiliary electrode 322, thereby preventing the lower surfaces of the middle first electrode 312 and the middle auxiliary electrode 322 from being corroded.

Therefore, an oxidation rate of each of the lower first electrode 311 and the lower auxiliary electrode 321 can be lower than that of each of the middle first electrode 312 and the middle auxiliary electrode 322. That is, the lower first electrode 311 and the lower auxiliary electrode 321 can be formed of a material which is stronger in corrosion resistance than a material of each of the middle first electrode 312 and the middle auxiliary electrode 322. As described above, each of the lower first electrode 311 and the lower auxiliary electrode 321 can act as an adhesive force enhancement layer or an anti-corrosion layer and can be formed of an alloy (MoTi) of Mo and Ti, but is not limited thereto.

The middle first electrode 312 can be provided between the lower first electrode 311 and the upper first electrode 313, and the middle auxiliary electrode 322 can be provided between the lower auxiliary electrode 321 and the upper auxiliary electrode 323. The middle first electrode 312 and the middle auxiliary electrode 322 can be formed of Cu which is low in resistance, but is not limited thereto. The middle first electrode 312 and the middle auxiliary electrode 322 can be formed of a material which is relatively lower in resistance than the lower first electrode 311 and the lower auxiliary electrode 321. A thickness of each of the middle first electrode 312 and the middle auxiliary electrode 322 can be set thicker than that of each of the lower first electrode 311 and the lower auxiliary electrode 321 so as to reduce a total resistance of the first electrode 310 and the auxiliary electrode 320.

The upper first electrode 313 and the upper auxiliary electrode 323 can protect upper surfaces of the middle first electrode 312 and the middle auxiliary electrode 322, thereby preventing the upper surfaces of the middle first electrode 312 and the middle auxiliary electrode 322 from being corroded.

Therefore, an oxidation rate of each of the upper first electrode 313 and the upper auxiliary electrode 323 can be lower than that of each of the middle first electrode 312 and the middle auxiliary electrode 322. That is, the upper first electrode 313 and the upper auxiliary electrode 323 can be formed of a material which is stronger in corrosion resistance than a material of each of the middle first electrode 312 and the middle auxiliary electrode 322. As described above, each of the upper first electrode 313 and the upper auxiliary electrode 323 can act as an adhesive force enhancement layer or an anti-corrosion layer and can be formed of a transparent conductive material such as ITO, but is not limited thereto.

The bank 400 can be provided between adjacent pixels of the plurality of pixels P. The bank 400 can be wholly provided in a matrix structure and can define an emission area in an individual pixel P. The bank 400 can be provided on the planarization layer 290 to hide both ends of each of the first electrode 310 and the auxiliary electrode 320. Therefore, a plurality of first electrodes 300 and auxiliary electrodes 320 respectively patterned in the plurality of pixels can be insulated from one another by the bank 400.

The light emitting layer 500 can be provided on the first electrode 310. The light emitting layer 500 can be provided to emit lights of different colors for each of the plurality of pixels P. For example, the light emitting layer 500 can be provided to emit red light, green light, and blue light, but is not limited thereto. The light emitting layer 500 can be provided to emit white light, and in this case, a color filter can be further provided in a traveling path of light emitted from the light emitting layer 500 for each of the plurality of pixels P.

Referring to FIG. 5A and FIG. 5B, the light emitting layer 500 according to an embodiment of the present disclosure can include a first light emitting layer 510, a buffer layer 520, and a second light emitting layer 530.

The first light emitting layer 510 can be provided on the first electrode 310. The first light emitting layer 510 can be provided in an emission area defined by the bank 400. The first light emitting layer 510 can include a hole injecting layer (HIL), a hole transporting layer (HTL), and a light emitting material layer (EML). In a red pixel, the EML can be a red EML R which emits red light. In a green pixel, the EML can be a green EML G which emits green light. In a blue pixel, the EML can be a blue EML B which emits blue light. The first light emitting layer 510 can be formed through an inkjet process. In detail, the first light emitting layer 510 can be patterned in each of the plurality of pixels P through the inkjet process using an inkjet apparatus without a mask.

The buffer layer 520 can be provided on the first light emitting layer 510. The buffer layer 520 can be provided in the emission area defined by the bank 400. The buffer layer 520 can be patterned in each of the plurality of pixels P through the inkjet process using the inkjet apparatus without a mask. That is, the buffer layer 520 can be provided on only the first light emitting layer 510 without being provided between the auxiliary electrode 320 and the second electrode 600. The buffer layer 520 can be formed of an organic material or comprise an organic material, and thus, there is no limitation in enhancing device performance. For example, the buffer layer 520 can be formed of a conductive organic material. Accordingly, the buffer layer 520 can act as a function layer having a desired function, based on a characteristic of each pixel.

Particularly, referring to FIG. 5A, the buffer layer 520 can be disposed in a blue pixel, and thus, can be disposed on the blue EML B. The buffer layer may not be disposed in a red or green pixel and thus may not be disposed on the red EML R or green EML G. The blue EML B can have a characteristic where combined excitons, electrons, or holes move to adjacent transporting layers due to a low T1 voltage level, and thus, emission efficiency is reduced in comparison with the red EML R and the green EML G. T1 voltage level represents the energy level, or voltage level, of the lowest triplet excited state. Therefore, the buffer layer 520 can be formed of a material which has a T1 voltage level higher than that of the blue EML B and has a highest occupied molecular orbital (HOMO) level value lower than that of the blue EML B, and can be provided on the blue EML B to enhance the device performance of the blue EML B. The buffer layer 520 can act as a blocking layer to prevent excitons, electrons, or holes from moving to adjacent electron injection layer. The buffer layer 520 can be formed of a material which has a T1 voltage level higher than those of the blue EML B, the green EML G and the red EML B. Referring to FIG. 5B, the buffer layer 520 can be disposed in a blue pixel, in a green pixel and in a red pixel, and thus, can be disposed on the blue EML B, on the green EML G and on the red EML B.

The buffer layer 520 can be formed of a material including carbazole or a material including fluorene or acridine. Also, the buffer layer 520 can be formed of one or more materials selected from the group consisting of an arylamine-based material, a starburst aromatic amine-based material, and a Spiro type material, but is not limited thereto.

Moreover, the buffer layer 520 can be formed of a polymer, an oligomer, or a monomer having a molecular weight of 800 or more, or can be formed of a material including an alkyl group. The polymer, the oligomer, the monomer, and the material including the alkyl group can be materials incapable of being applied to a deposition process, and thus, the buffer layer 520 can be formed through an inkjet process. As described above, the buffer layer 520 can be formed on the first light emitting layer 510 formed through the inkjet process by using the inkjet process instead of the deposition process, thereby minimizing an issue of an interface between the first light emitting layer 510 and the buffer layer 520.

Moreover, the buffer layer 520 can be formed of a material for reducing a roughness of an upper surface thereof. Therefore, even when the second light emitting layer 530 is formed on the buffer layer 520 through a deposition process, an issue of interfaces is reduced. Also, the buffer layer 520 can be formed on the first light emitting layer 510 through the inkjet process in a state where the second light emitting layer 530 is not deposited on the first light emitting layer 510, and then, the second light emitting layer 530 can be formed on the buffer layer 520 through the deposition process, thereby protecting an upper surface of the first light emitting layer 510.

Moreover, the buffer layer 520 can function as an electron transporting layer (ETL).

The second light emitting layer 530 can be provided on the buffer layer 520 and the auxiliary electrode 320. The second light emitting layer 530 can be wholly formed on the substrate 100 through a deposition process, except the pad area PA. Therefore, the second light emitting layer 530 can also be provided on an upper surface of the bank 400. Since the second light emitting layer 530 is disposed between the auxiliary electrode 320 and the second electrode 600, the second light emitting layer 530 can be formed of a conductive material (for example, metal) so as to electrically connect the auxiliary electrode 320 to the second electrode 600. Accordingly, the auxiliary electrode 320 can be electrically connected to the second electrode 600 through the second light emitting layer 530. The second light emitting layer 530 can include an electron injecting layer (EIL).

The second electrode 600 can be provided on the light emitting layer 500. In more detail, the second electrode 600 can be provided on the second light emitting layer 530. The second electrode 600 can function as a cathode of the electroluminescence display apparatus. The second electrode 600 can be provided on the bank 400 as well as the light emitting layer 500. Therefore, the second electrode 600 can function as a common electrode which applies a common voltage to the plurality of pixels.

An encapsulation layer can be provided on the second electrode 600. The encapsulation layer can be disposed to cover the active area AA, and moreover, can be disposed to cover the dummy area DA. The encapsulation layer can prevent oxygen or water from penetrating into the TFT and the light emitting layer 500. To this end, the encapsulation layer can include at least one inorganic layer and at least one organic layer.

A circuit element layer 200, a bank 400, a dummy light emitting layer 500, and a second electrode 600 can be provided in the dummy area DA on the substrate 100.

The circuit element layer 200 provided in the dummy area DA can be formed to have the same structure through the same process as the circuit element layer 200 provided in the active area AA.

However, the present embodiment is not limited thereto. In other embodiments, some of signal lines such as a gate line, a data line, a power line, and a reference line may not be provided in the circuit element layer 200 provided in the dummy area DA, or at least one of a switching TFT and a driving TFT may not be provided in the circuit element layer 200. Therefore, light may not be emitted in the dummy area DA. Depending on the case, the circuit element layer 200 provided in the dummy area DA can be incompletely configured so that one of the switching TFT and the driving TFT does not operate.

The bank 400 provided in the dummy area DA can be provided between adjacent dummy pixels of a plurality of dummy pixels DP. The bank 400 provided in the dummy area DA can define a dummy emission area in an individual dummy pixel DP. In the drawing, only one pixel DP is illustrated as being provided in the dummy area DA, but the plurality of dummy pixels DP can be provided in the dummy area DA.

Similarly to the bank 400 provided in the active area AA, the bank 400 provided in the dummy area DA can be wholly provided in a matrix structure and can define the dummy emission area in an individual dummy pixel DP. As a result, the bank 400 can be provided in the matrix structure in the active area AA and the dummy area DA.

The dummy light emitting layer 500 provided in the dummy area DA can be provided on the circuit element layer 200. The dummy light emitting layer 500 provided in the dummy area DA can be formed of the same material to have the same thickness as the light emitting layer 500 provided in the active area AA.

Since the dummy area DA is not a display area which displays an image, the dummy pixels DP provided in the dummy area DA can be configured so as not to emit light. However, for some reason, if light is emitted in the dummy area DA, the display quality of the electroluminescence display apparatus can be degraded due to leakage light occurring in the dummy area DA.

In order for light not to be emitted from the dummy pixels DP, a TFT may not be provided in the circuit element layer 200 disposed in the dummy area DA, or a first electrode may not be provided in the dummy area DA.

The second electrode 600 provided in the dummy area DA can be formed in a structure which extends from the second electrode 600 provided in the active area AA. However, the second electrode 600 may not be provided in the dummy area DA, and thus, light may not be emitted in the dummy area DA.

A pad 700 can be provided in the pad area PA on the substrate 100. The pad 700 can include a signal pad 710 and a pad electrode 720.

The signal pad 710 can be provided on the insulation layer 225. The signal pad 710 can be provided on the same layer as the gate electrode 230 provided in the active area AA. The signal pad 710 can include a lower signal pad 711 and an upper signal pad 712.

The lower signal pad 711 can be formed of the same material to have the same thickness as the lower gate electrode 231, and the upper signal pad 712 can be formed of the same material to have the same thickness as the upper gate electrode 232. In this case, the signal pad 710 and the gate electrode 230 can be simultaneously formed through the same process.

The pad electrode 720 can be provided on the interlayer insulation layer 250. The pad electrode 720 can be provided on the same layer as the source and drain electrodes 260 and 265 provided in the active area AA. The pad electrode 720 can be connected to the signal pad 710 through a contact hole. The pad electrode 720 can be externally exposed and can be connected to an external driver. The pad electrode 720 can include a lower pad electrode 721, a middle pad electrode 722, and an upper pad electrode 723.

The lower pad electrode 721 can be formed of the same material to have the same thickness as the lower source and drain electrodes 261 and 266, the middle pad electrode 722 can be formed of the same material to have the same thickness as the middle source and drain electrodes 262 and 267, and the upper pad electrode 723 can be formed of the same material to have the same thickness as the upper source and drain electrodes 263 and 268. In this case, the pad electrode 720 and the source and drain electrodes 260 and 265 can be simultaneously formed through the same process.

As described above, in the electroluminescence display apparatus according to the embodiments of the present disclosure, since the buffer layer 520 is formed on the first light emitting layer 510 through the inkjet process, the buffer layer 520 can be provided on only the first light emitting layer 510, and thus, the buffer layer 520 can be formed of an organic material or comprise an organic material, thereby enhancing the device performance of the blue pixel.

Moreover, in the electroluminescence display apparatus according to the embodiments of the present disclosure, since the buffer layer 520 is formed on the first light emitting layer 510 through the inkjet process, an issue occurring on the interface between the first light emitting layer 510 formed through the inkjet process and the second light emitting layer 530 formed through the deposition process is reduced, thereby preventing the efficiency and lifetime of the organic light emitting device from being reduced.

FIGS. 6 to 9 are examples of graphs comparing a related art electroluminescence display apparatus with an electroluminescence display apparatus according to an embodiment of the present disclosure.

In the related art electroluminescence display apparatus, an organic light emitting device includes a first electrode, a first light emitting layer, a second light emitting layer, and a second electrode without a buffer layer. On the other hand, in the electroluminescence display apparatus according to an embodiment of the present disclosure, as described above with reference to FIGS. 4 and 5 as examples only, an organic light emitting device includes a first electrode, a first light emitting layer, a buffer layer, a second light emitting layer, and a second electrode.

Figure 6:
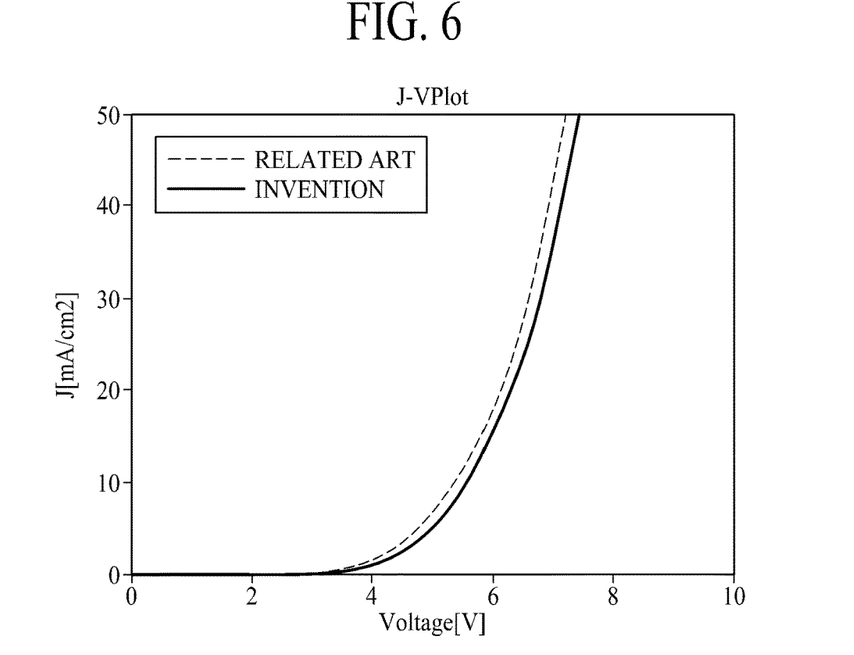
FIG. 6 is a graph comparing a driving voltage of a related art electroluminescence display apparatus with a driving voltage of an electroluminescence display apparatus according to an embodiment of the present disclosure.

FIG. 6 is a graph comparing a driving voltage of the related art electroluminescence display apparatus with a driving voltage of the electroluminescence display apparatus according to an embodiment of the present disclosure.

Referring to FIG. 6, in the related art electroluminescence display apparatus, when a current density (J) is 0 mA/cm2 to 50 mA/cm2, a driving voltage is within a range of about 3 V to 7 V. In the electroluminescence display apparatus according to the embodiment of the present disclosure, when a current density is 0 mA/cm2 to 50 mA/cm2, a driving voltage is within a range of about 3 V to 7.2 V. In comparison with the related art electroluminescence display apparatus, the electroluminescence display apparatus according to the embodiment of the present disclosure further includes the buffer layer 520, but there is hardly a difference between the driving voltages.

Figure 7:
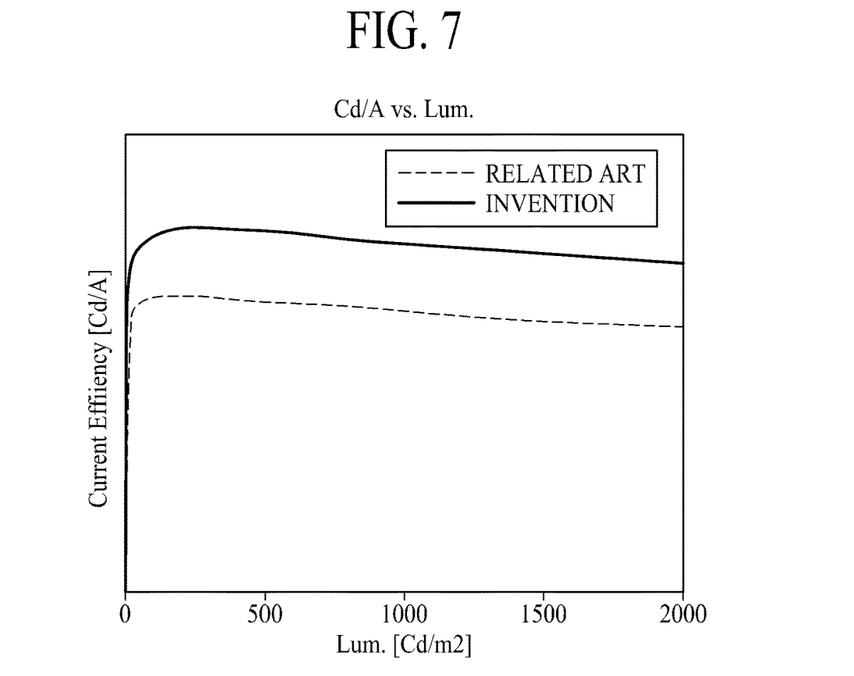
FIG. 7 is a graph comparing a current efficiency of a related art electroluminescence display apparatus with a current efficiency of an electroluminescence display apparatus according to an embodiment of the present disclosure.

FIG. 7 is a graph comparing a current efficiency of the related art electroluminescence display apparatus with a current efficiency of the electroluminescence display apparatus according to an embodiment of the present disclosure.

Referring to FIG. 7, when panel luminance is 0 Cd/m2 to 2,000 Cd/m2, a current efficiency of the electroluminescence display apparatus according to the embodiment of the present disclosure is far higher than a current efficiency of the related art electroluminescence display apparatus.

Figure 8:
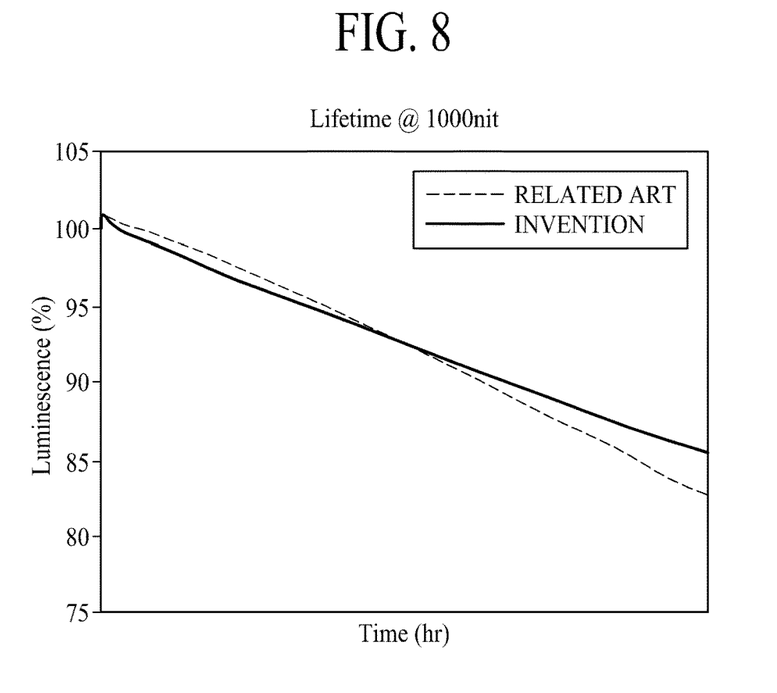
FIG. 8 is a graph comparing a lifetime of a related art electroluminescence display apparatus with a lifetime of an electroluminescence display apparatus according to an embodiment of the present disclosure.

FIG. 8 is a graph comparing a lifetime of the related art electroluminescence display apparatus with a lifetime of the electroluminescence display apparatus according to an embodiment of the present disclosure.

Referring to FIG. 8, in the related art electroluminescence display apparatus, luminescence is reduced from about 101% to about 83% with time. In the electroluminescence display apparatus according to the embodiment of the present disclosure, even when the same time as the related art electroluminescence display apparatus elapses, luminescence is reduced from about 101% to about 86%. As described above, a lifetime of the electroluminescence display apparatus according to an embodiment of the present disclosure is longer than a lifetime of the related art electroluminescence display apparatus.

Figure 9:
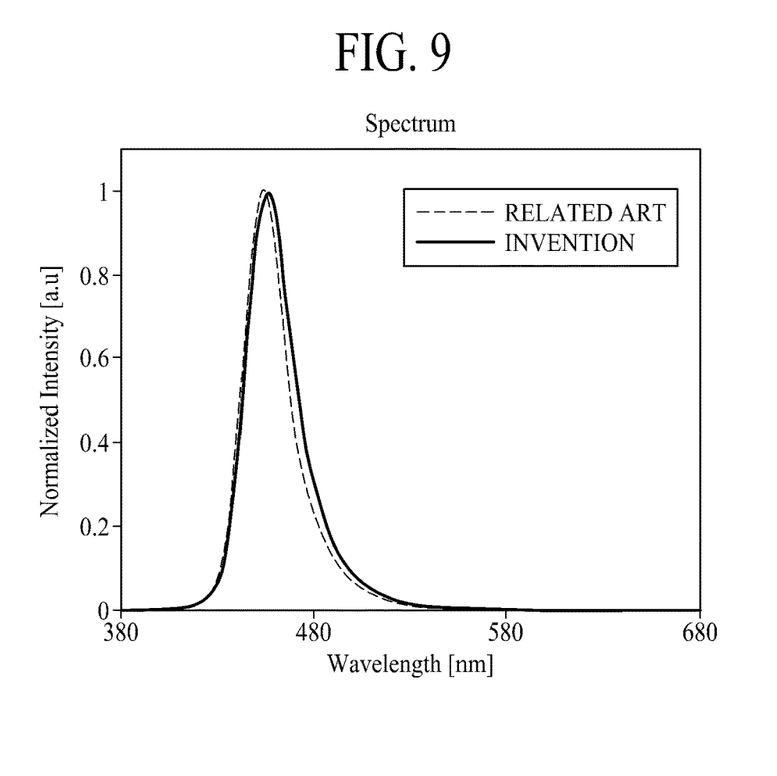
FIG. 9 is a graph comparing a normalized intensity of light of a related art electroluminescence display apparatus with a normalized intensity of light of an electroluminescence display apparatus according to an embodiment of the present disclosure with respect to a wavelength.

FIG. 9 is a graph comparing a normalized intensity of light of a related art electroluminescence display apparatus with a normalized intensity of light of an electroluminescence display apparatus according to an embodiment of the present disclosure with respect to a wavelength.

Referring to FIG. 9, in comparison with the related art electroluminescence display apparatus, the electroluminescence display apparatus according to the embodiment of the present disclosure further includes the buffer layer 520, but a normalized intensity of light of the electroluminescence display apparatus according to the embodiment of the present disclosure is almost similar to a normalized intensity of light of the related art electroluminescence display apparatus with respect to a wavelength.

As described above, in the electroluminescence display apparatus according to the embodiments of the present disclosure, since the buffer layer is formed on the first light emitting layer through the inkjet process, the buffer layer can be provided on only the first light emitting layer, and thus, the buffer layer can be formed of an organic material or comprise an organic material, thereby enhancing the device performance of the blue pixel.

Moreover, in the electroluminescence display apparatus according to the embodiments of the present disclosure, since the buffer layer is formed on the first light emitting layer through the inkjet process, an issue occurring on the interface between the first light emitting layer formed through the inkjet process and the second light emitting layer formed through the deposition process is reduced or effectively addressed, thereby preventing or minimizing the efficiency and lifetime of the organic light emitting device from being degraded.

It will be apparent to those skilled in the art that various modifications and variations can be made in the present disclosure without departing from the scope of the disclosures. Thus, it is intended that the present invention covers the modifications and variations of this disclosure provided they come within the scope of the appended claims and their equivalents.

The following list provides aspects of the disclosure and forms part of the description. These aspects can be combined in any compatible combination beyond those expressly stated. The aspects can also be combined with any compatible features described herein:

Aspect 1. An electroluminescence display apparatus comprising:
 a substrate including an active area including a plurality of pixels;
 a circuit element layer disposed on the substrate;
 a first electrode disposed on the circuit element layer;
 an auxiliary electrode disposed on the circuit element layer and spaced apart from the first electrode;
 a first light emitting layer disposed on the first electrode;
 a buffer layer disposed on the first light emitting layer;
 a second light emitting layer disposed on the buffer layer and the auxiliary electrode;
 and a second electrode disposed on the second light emitting layer.

Aspect 2. The electroluminescence display apparatus of aspect 1, wherein the buffer layer comprises a nonconductive material.

Aspect 3. The electroluminescence display apparatus of aspect 1, wherein the first light emitting layer comprises a blue light emitting material layer, and the buffer layer is disposed on the blue light emitting material layer.

Aspect 4. The electroluminescence display apparatus of aspect 3, wherein the buffer layer comprises a T1 voltage level higher than a T1 voltage level of the blue light emitting material layer, and a highest occupied molecular orbital (HOMO) level value lower than a HOMO level value of the blue light emitting material layer.

Aspect 5. The electroluminescence display apparatus of aspect 1, wherein the buffer layer comprises a polymer, an oligomer, or a monomer having a molecular weight of 800 or more.

Aspect 6. The electroluminescence display apparatus of aspect 1, wherein the buffer layer comprises a material including an alkyl group.

Aspect 7. The electroluminescence display apparatus of aspect 1, wherein the buffer layer comprises a material including either carbazole or a material including fluorene or acridine.

Aspect 8. The electroluminescence display apparatus of aspect 1, wherein the buffer layer comprises one or more materials selected from a group including an arylamine-based material, a starburst aromatic amine-based material, and a spiro type material.

Aspect 9. The electroluminescence display apparatus of aspect 1, wherein the buffer layer is formed through an inkjet process.

Aspect 10. The electroluminescence display apparatus of aspect 1, wherein the first light emitting layer is formed through an inkjet process, and the second light emitting layer is formed through a deposition process.

Aspect 11. The electroluminescence display apparatus of aspect 1, wherein the first light emitting layer comprises a hole injecting layer, a hole transporting layer, and a light emitting material layer, and the second light emitting layer comprises an electron injecting layer.

Aspect 12. The electroluminescence display apparatus of aspect 1, wherein the second light emitting layer comprises a conductive material and is electrically connected to the auxiliary electrode and the second electrode.

Aspect 13. An electroluminescence display apparatus comprising:
a substrate including an active area including a red pixel, a green pixel, and a blue pixel;
a first electrode and an auxiliary electrode disposed on the substrate and spaced apart from each other;
a bank disposed in an edge of each of the first electrode and the auxiliary electrode to define an emission area in the active area;
a first light emitting layer disposed in the emission area provided on the first electrode;
a buffer layer disposed on the first light emitting layer;
a second light emitting layer disposed on the buffer layer and the auxiliary electrode; and
a second electrode disposed on the second light emitting layer,
wherein the buffer layer is disposed in the blue pixel.

Aspect 14. The electroluminescence display apparatus of aspect 13, wherein the buffer layer comprises a nonconductive material.

Aspect 15. The electroluminescence display apparatus of aspect 13, wherein
the first light emitting layer comprises a hole injecting layer, a hole transporting layer, and a light emitting material layer,
the second light emitting layer comprises an electron injecting layer, and
the first light emitting layer and the buffer layer are formed through an inkjet process, and the second light emitting layer is formed through a deposition process.

What is claimed is:
1. An electroluminescence display apparatus comprising:
a substrate including an active area including a plurality of pixels, and a dummy area provided at a periphery of the active area;
a circuit element layer disposed on the substrate;
a first electrode disposed on the circuit element layer in the active area;
an auxiliary electrode disposed on the circuit element layer and spaced apart from the first electrode in the active area;
a first light emitting layer disposed on the first electrode;
an electron injecting layer disposed on the first light emitting layer and the auxiliary electrode;
a buffer layer disposed between the first light emitting layer and the electron injecting layer;
a second electrode disposed on the electron injecting layer; and
a dummy pixel on the substrate in the dummy area, the dummy pixel including a first light emitting area configured not to emit light, the buffer layer, the electron injecting layer and the second electrode,
wherein the buffer layer is not included between the auxiliary electrode and the electron injecting layer, and
wherein the first light emitting layer is between the buffer layer and the first electrode in the active layer.

2. The electroluminescence display apparatus of claim 1, wherein the buffer layer comprises an organic material.

3. The electroluminescence display apparatus of claim 1, wherein the first light emitting layer comprises a blue light emitting material layer, and the buffer layer is disposed on the blue light emitting material layer.

4. The electroluminescence display apparatus of claim 3, wherein the buffer layer comprises a T1 voltage level higher than a T1 voltage level of the blue light emitting material layer, and a highest occupied molecular orbital (HOMO) level value lower than a HOMO level value of the blue light emitting material layer.

5. The electroluminescence display apparatus of claim 1, wherein the buffer layer comprises a polymer, an oligomer, or a monomer having a molecular weight of 800 or more.

6. The electroluminescence display apparatus of claim 1, wherein the buffer layer comprises a material including an alkyl group.

7. The electroluminescence display apparatus of claim 1, wherein the buffer layer comprises a material including either carbazole or a material including fluorene or acridine.

8. The electroluminescence display apparatus of claim 1, wherein the buffer layer comprises one or more materials selected from a group including an arylamine-based material, a starburst aromatic amine-based material, and a Spiro type material.

9. The electroluminescence display apparatus of claim 1, wherein the buffer layer is inkjet printed.

10. The electroluminescence display apparatus of claim 1, wherein the first light emitting layer is inkjet printed and the electron injecting layer is formed through a deposition process.

11. The electroluminescence display apparatus of claim 1, wherein the first light emitting layer comprises a hole injecting layer, a hole transporting layer, and a light emitting material layer.

12. The electroluminescence display apparatus of claim 1, wherein the electron injecting layer comprises a conductive material and is electrically connected to the auxiliary electrode and the second electrode.

13. The electroluminescence display apparatus of claim 1, wherein the buffer layer is inkjet printed.

14. The electroluminescence display apparatus claim 1, wherein the first light emitting layer is inkjet printed and the electron injecting layer is formed through a deposition process.

15. An electroluminescence display apparatus comprising:
   a substrate including an active area including a red pixel, a green pixel, and a blue pixel;
   a first electrode and an auxiliary electrode disposed on the substrate and spaced apart from each other;
   a bank disposed at an edge of each of the first electrode and the auxiliary electrode to define an emission area in the active area;
   a first light emitting layer disposed in the emission area provided on the first electrode, the first light emitting layer including a red light emitting material layer in the red pixel, a green light emitting material layer in the green pixel and a blue light emitting material layer in the blue pixel;
   an electron injecting layer disposed on the first light emitting layer and the auxiliary electrode;
   a buffer layer disposed between the blue light emitting material layer and the electron injecting layer; and
   a second electrode disposed on the electron injecting layer,
   wherein the red light emitting material layer and green light emitting material layer contact the electron injecting layer, and
   wherein the blue light emitting material layer contacts the buffer layer.

16. The electroluminescence display apparatus of claim 15, wherein the buffer layer comprises an organic material.

17. The electroluminescence display apparatus of claim 15, wherein
   the first light emitting layer further comprises a hole injecting layer and a hole transporting layer, and
   the first light emitting layer and the buffer layer are inkjet printed, and the electron injecting layer is formed through a deposition process.

18. The electroluminescence display apparatus of claim 15, wherein the substrate further comprises a dummy area provided at a periphery of the active area.

* * * * *